US011630140B2

(12) United States Patent
Vallamkondu et al.

(10) Patent No.: US 11,630,140 B2
(45) Date of Patent: Apr. 18, 2023

(54) PROGNOSTIC HEALTH MONITORING FOR HEATER

(71) Applicant: Rosemount Aerospace Inc., Charlotte, NC (US)

(72) Inventors: Aswin Kumar Vallamkondu, Banglore (IN); Magdi A. Essawy, Lakeville, MN (US); Anand Kumar Kalairaj, Andhra Pradesh (IN); Madhusudh Obula Venkataiah, Banglore (IN)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 366 days.

(21) Appl. No.: 16/946,652

(22) Filed: Jun. 30, 2020

(65) Prior Publication Data

US 2021/0364561 A1 Nov. 25, 2021

(30) Foreign Application Priority Data

Apr. 22, 2020 (IN) .............................. 202041017303

(51) Int. Cl.
*G01R 27/26* (2006.01)
*B64F 5/60* (2017.01)
*G01R 31/00* (2006.01)

(52) U.S. Cl.
CPC ............ *G01R 27/2605* (2013.01); *B64F 5/60* (2017.01); *G01R 31/008* (2013.01)

(58) Field of Classification Search
CPC ..... G01R 27/2605; G01R 31/008; B64F 5/60; B64D 45/00; B64D 15/12; B64D 43/02;
(Continued)

(56) References Cited

U.S. PATENT DOCUMENTS 3,795,652 A 3/1974 Sakamoto et al.
3,798,652 A 3/1974 Williams
(Continued)

FOREIGN PATENT DOCUMENTS

CA 1311028 C 12/1992
CN 105092050 A 11/2015
(Continued)

OTHER PUBLICATIONS

Bechhoefer, John, et al. "Temperature Dependence of the Capacitance of a Ferroelectric Material." in: American Journal of Physics (2007), vol. 75, No. 11, pp. 1046-1053.
(Continued)

*Primary Examiner* — Farhana A Hoque
(74) *Attorney, Agent, or Firm* — Kinney & Lange, P.A.

(57) ABSTRACT

A system and method for monitoring the health of a heater connected to a power supply by first and second power leads which conduct an inlet and outlet current, respectively. The system includes an injection transformer with a number of primary turns that are inductively coupled to the first power lead, a signal generator configured to generate and supply a time-varying injection signal to the primary turns thereby imposing the time-varying injection signal on the inlet current, and a signal reader configured to receive a diagnostic signal from the heater, filter the diagnostic signal to pass a frequency associated with the time-varying injection signal, and produce a heater capacitance signal that is indicative of a capacitance value of the heater, where the heater capacitance signal is indicative of the health of the heater.

18 Claims, 6 Drawing Sheets

(58) Field of Classification Search
CPC .......... B64D 2045/0085; H05B 1/0236; G01P 13/025; G01P 21/025; G01P 5/165
See application file for complete search history.

(56) References Cited

U.S. PATENT DOCUMENTS

| | | | |
|---|---|---|---|
| 4,121,088 A | 10/1978 | Doremus et al. | |
| 4,207,566 A | 6/1980 | Gitlin et al. | |
| 4,267,721 A | 5/1981 | Longenecker et al. | |
| 4,506,259 A | 3/1985 | Rhodes | |
| 4,698,583 A | 10/1987 | Sandberg | |
| 5,130,652 A | 7/1992 | Kawakami et al. | |
| 5,216,226 A | 6/1993 | Miyoshi | |
| 5,218,294 A | 6/1993 | Soiferman | |
| 5,464,965 A | 11/1995 | McGregor et al. | |
| 5,767,781 A | 6/1998 | Yavelberg | |
| 5,883,512 A | 3/1999 | Streit et al. | |
| 5,986,444 A | 11/1999 | Powell | |
| 6,070,475 A | 6/2000 | Muehlhauser et al. | |
| 6,107,611 A | 8/2000 | Jones | |
| 6,151,560 A | 11/2000 | Jones | |
| 6,188,423 B1 | 2/2001 | Pou | |
| 6,218,647 B1 | 4/2001 | Jones | |
| 6,266,219 B1* | 7/2001 | Macbeth | H02H 1/0015 361/93.6 |
| 6,270,460 B1 | 8/2001 | McCartan et al. | |
| 6,300,767 B1 | 10/2001 | Kliman et al. | |
| 6,336,083 B1 | 1/2002 | Lanham et al. | |
| 6,400,334 B1 | 6/2002 | Lindenmeier et al. | |
| 6,414,282 B1 | 7/2002 | Ice et al. | |
| 6,414,508 B1 | 7/2002 | London | |
| 6,430,996 B1 | 8/2002 | Anderson et al. | |
| 6,476,624 B1 | 11/2002 | Chuman et al. | |
| 6,906,537 B2 | 6/2005 | Goldberg et al. | |
| 7,012,538 B2 | 3/2006 | Peck et al. | |
| 7,193,428 B1 | 3/2007 | Baron et al. | |
| 7,202,451 B2 | 4/2007 | Uchida et al. | |
| 7,209,651 B1 | 4/2007 | Knoeppel et al. | |
| 7,219,023 B2 | 5/2007 | Banke et al. | |
| 7,256,372 B2 | 8/2007 | Knoeppel et al. | |
| 7,490,510 B2 | 2/2009 | Agami et al. | |
| 7,647,843 B2 | 1/2010 | Burton | |
| 8,182,143 B2 | 5/2012 | Fleming et al. | |
| 8,269,513 B2 | 9/2012 | Palm et al. | |
| 8,466,390 B2 | 6/2013 | Gaertner et al. | |
| 8,711,008 B2 | 4/2014 | Cook et al. | |
| 8,890,703 B2 | 11/2014 | Farris et al. | |
| 9,046,899 B2 | 6/2015 | Shearer et al. | |
| 9,080,917 B2 | 7/2015 | Nguyen et al. | |
| 9,463,879 B2 | 10/2016 | Khozikov et al. | |
| 9,638,436 B2 | 5/2017 | Arensmeier et al. | |
| 9,654,054 B1* | 5/2017 | Omoumi | H03F 3/45076 |
| 9,733,135 B2 | 8/2017 | Feau et al. | |
| 9,885,761 B2 | 2/2018 | Schram | |
| 9,919,812 B2 | 3/2018 | Shi | |
| 9,927,480 B2 | 3/2018 | Nesnidal | |
| 9,939,459 B2 | 4/2018 | Dichek | |
| 10,151,785 B2 | 12/2018 | Essawy et al. | |
| 10,180,449 B2 | 1/2019 | Essawy et al. | |
| 10,197,517 B2 | 2/2019 | Essawy et al. | |
| 10,564,203 B2 | 2/2020 | Essawy et al. | |
| 11,060,992 B2 | 7/2021 | Fok et al. | |
| 2001/0054611 A1 | 12/2001 | Miyahara et al. | |
| 2002/0078752 A1 | 6/2002 | Braunling et al. | |
| 2002/0154029 A1 | 10/2002 | Watt et al. | |
| 2003/0169031 A1 | 9/2003 | Viola | |
| 2003/0206111 A1 | 11/2003 | Gao et al. | |
| 2004/0032270 A1 | 2/2004 | Goldberg et al. | |
| 2004/0075567 A1 | 4/2004 | Peck et al. | |
| 2004/0124358 A1 | 7/2004 | Okamura et al. | |
| 2004/0217106 A1 | 11/2004 | Giterman | |
| 2004/0243949 A1 | 12/2004 | Wang et al. | |
| 2005/0200363 A1 | 9/2005 | Hasegawa et al. | |
| 2005/0231153 A1 | 10/2005 | Dewey et al. | |
| 2005/0232331 A1 | 10/2005 | Severson | |
| 2005/0232332 A1 | 10/2005 | Hanson et al. | |
| 2006/0033504 A1 | 2/2006 | Barber et al. | |
| 2006/0096971 A1 | 5/2006 | Reusche et al. | |
| 2006/0250143 A1 | 11/2006 | Moon et al. | |
| 2007/0084857 A1 | 4/2007 | Osaka | |
| 2007/0125764 A1* | 6/2007 | Knoeppel | H05B 1/0283 219/497 |
| 2007/0208520 A1 | 9/2007 | Zhang et al. | |
| 2008/0018340 A1 | 1/2008 | Arnou et al. | |
| 2008/0112100 A1 | 5/2008 | Liu | |
| 2008/0183404 A1 | 7/2008 | Emami et al. | |
| 2008/0250796 A1 | 10/2008 | Clugston et al. | |
| 2009/0055036 A1 | 2/2009 | Vozhdaev et al. | |
| 2009/0065502 A1 | 3/2009 | Suenaga et al. | |
| 2009/0251152 A1 | 10/2009 | Ammann | |
| 2009/0321415 A1 | 12/2009 | Zhang et al. | |
| 2010/0108662 A1 | 5/2010 | Taylor et al. | |
| 2010/0156426 A1 | 6/2010 | Kang et al. | |
| 2010/0163433 A1 | 7/2010 | Horn | |
| 2010/0213960 A1 | 8/2010 | Mok et al. | |
| 2010/0231249 A1 | 9/2010 | Dang et al. | |
| 2011/0036160 A1 | 2/2011 | Pineau et al. | |
| 2011/0058397 A1 | 3/2011 | Rizzo | |
| 2011/0089958 A1 | 4/2011 | Shah et al. | |
| 2011/0106475 A1 | 5/2011 | Wigen | |
| 2011/0118990 A1 | 5/2011 | Sidhu et al. | |
| 2011/0290784 A1 | 12/2011 | Oraweiz et al. | |
| 2011/0320139 A1 | 12/2011 | Amir et al. | |
| 2012/0133384 A1 | 5/2012 | Palais et al. | |
| 2012/0213246 A1 | 8/2012 | Honbo et al. | |
| 2012/0268074 A1 | 10/2012 | Cooley et al. | |
| 2012/0319706 A1 | 12/2012 | Nadel et al. | |
| 2013/0037535 A1 | 2/2013 | Ogasawara et al. | |
| 2013/0039565 A1 | 2/2013 | Takeshima | |
| 2013/0194101 A1 | 8/2013 | Devupalli | |
| 2013/0314082 A1 | 11/2013 | Lee et al. | |
| 2014/0033175 A1 | 1/2014 | Lee et al. | |
| 2014/0103938 A1 | 4/2014 | Jones | |
| 2014/0238968 A1 | 8/2014 | Lee | |
| 2014/0245830 A1 | 9/2014 | Martin et al. | |
| 2014/0331751 A1 | 11/2014 | MacDonald | |
| 2015/0014303 A1 | 1/2015 | Kohler et al. | |
| 2015/0042980 A1 | 2/2015 | Liu et al. | |
| 2015/0055940 A1 | 2/2015 | Steinhauser | |
| 2015/0104888 A1 | 4/2015 | Lee | |
| 2015/0123688 A1 | 5/2015 | Sappok et al. | |
| 2015/0142343 A1 | 5/2015 | Zach et al. | |
| 2015/0160148 A1 | 6/2015 | Stanley | |
| 2015/0174843 A1 | 6/2015 | Crepin et al. | |
| 2015/0237680 A1* | 8/2015 | Ono | G01R 21/06 219/662 |
| 2016/0013169 A1 | 1/2016 | Standing | |
| 2016/0054233 A1 | 2/2016 | Bense et al. | |
| 2016/0084986 A1 | 3/2016 | Zach et al. | |
| 2016/0131690 A1 | 5/2016 | Ueno et al. | |
| 2016/0131691 A1 | 5/2016 | Nesnidal | |
| 2016/0178221 A1 | 6/2016 | Thornton et al. | |
| 2016/0178680 A1 | 6/2016 | Ntziachristos | |
| 2016/0255184 A1 | 9/2016 | Hwang | |
| 2016/0291051 A1 | 10/2016 | Golly et al. | |
| 2016/0313259 A1 | 10/2016 | Shayovitz | |
| 2016/0338569 A1 | 11/2016 | Reder et al. | |
| 2016/0364629 A1 | 12/2016 | Solli | |
| 2016/0377487 A1 | 12/2016 | Cheung et al. | |
| 2017/0016947 A1 | 1/2017 | Polzer | |
| 2017/0037090 A1 | 2/2017 | Richmond et al. | |
| 2017/0099699 A1 | 4/2017 | Nosrati et al. | |
| 2017/0110887 A1 | 4/2017 | Bell et al. | |
| 2017/0167925 A1 | 6/2017 | Safai et al. | |
| 2017/0182447 A1 | 6/2017 | Sappok et al. | |
| 2017/0191875 A1 | 7/2017 | Schmidt et al. | |
| 2017/0215936 A1 | 8/2017 | Wallace | |
| 2017/0259927 A1 | 9/2017 | Schram | |
| 2017/0299626 A1 | 10/2017 | Dichek | |
| 2017/0336156 A1 | 11/2017 | Phillips | |
| 2017/0343418 A1 | 11/2017 | Hurbi et al. | |
| 2017/0370748 A1 | 12/2017 | Fuller | |
| 2017/0370960 A1 | 12/2017 | Benning et al. | |
| 2017/0374296 A1 | 12/2017 | Schmidt | |

(56) References Cited

U.S. PATENT DOCUMENTS

| | | |
|---|---|---|
| 2018/0026550 A1 | 1/2018 | Dent |
| 2018/0037338 A1* | 2/2018 | Shi .................. G01R 31/008 |
| 2018/0123441 A1 | 5/2018 | Yanai |
| 2018/0183404 A1 | 6/2018 | Jourdan et al. |
| 2018/0275080 A1 | 9/2018 | Essawy et al. |
| 2018/0275085 A1 | 9/2018 | Fok et al. |
| 2018/0275181 A1 | 9/2018 | Essawy et al. |
| 2018/0275182 A1 | 9/2018 | Essawy et al. |
| 2018/0275183 A1 | 9/2018 | Essawy et al. |
| 2018/0275184 A1* | 9/2018 | Essawy .................. H05B 1/0236 |
| 2018/0275185 A1 | 9/2018 | Essawy et al. |
| 2018/0290756 A1 | 10/2018 | White et al. |
| 2019/0297675 A1 | 9/2019 | Vadgaonkar et al. |
| 2019/0382139 A1 | 12/2019 | Shi |
| 2020/0011761 A1 | 1/2020 | Pado |
| 2020/0191851 A1 | 6/2020 | Essawy et al. |
| 2020/0391871 A1 | 12/2020 | Essawy et al. |

FOREIGN PATENT DOCUMENTS

| | | |
|---|---|---|
| CN | 109246868 A | 1/2019 |
| CN | 109521252 A | 3/2019 |
| DE | 19833454 A1 | 2/2000 |
| EP | 1441429 A1 | 7/2004 |
| EP | 2755443 B1 | 1/2017 |
| EP | 3018057 | 9/2017 |
| EP | 3281874 A1 | 2/2018 |
| EP | 3379265 A1 | 9/2018 |
| EP | 3379266 A1 | 9/2018 |
| EP | 3745141 A1 | 12/2020 |
| GB | 809608 A | 2/1959 |
| GB | 884415 A | 12/1961 |
| GB | 2561393 B | 12/2019 |
| JP | H0720577 U | 4/1995 |
| JP | 2006088391 A | 4/2006 |
| JP | 2012198123 A | 10/2012 |
| KR | 20110124542 A | 11/2011 |
| KR | 101110789 B1 | 2/2012 |
| KR | 20120062301 A | 6/2012 |
| WO | 9011532 A1 | 10/1990 |
| WO | 9816837 A1 | 4/1998 |
| WO | 9943066 A1 | 8/1999 |
| WO | 2011026740 A1 | 3/2011 |
| WO | 2013107371 A1 | 7/2013 |

OTHER PUBLICATIONS

Cedric Gillet and Andreas Freidrich, "Guidelines for Designing a Concentrator for High-Current Sensing Applications with an Allegro Hall-Effect Sensor IC", 2013, 7 pages.

Communication Pursuant to Article 94(3) EPC for European Patent Application No. 18153822.4, dated Jan. 16, 2020, 4 pages.
Communication Pursuant to Article 94(3) EPC for European Patent Application No. 18153824.0, dated Jan. 16, 2020, 5 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18162251.5, dated Jun. 12, 2019, 3 pages.
Extended European Search Report dated Jul. 26, 2021, received for corresponding European Application No. 21164413.3, eight pages.
Extended European Search Report for European Patent Application No. 18153822.4, dated May 17, 2018, 9 pages.
Extended European Search Report for European Patent Application No. 18153824.0, dated May 17, 2018, 9 pages.
Extended European Search Report for European Patent Application No. 18153825.7, dated Apr. 9, 2018, 7 pages.
Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 18153834.9, dated May 29, 2018, 9 pages.
Extended European Search Report for European Patent Application No. 18162251.5, dated Jul. 5, 2018, 9 pages.
Extended European Search Report for European Patent Application No. 19203208.4, dated Nov. 18, 2019, 6 pages.
Extended European Search Report for European Patent Application No. 19205621.6, dated Nov. 22, 2019, 9 pages.
Extended European Search Report for European Patent Application No. 19207401.1, dated Jan. 27, 2020, 8 pages.
Extended European Search Report for European Patent Application No. 19213783.4, dated Jun. 23, 2020, 7 pages.
Extended European Search Report for European Patent Application No. 19214929.2, dated May 4, 2020, 8 pages.
Extended European Search Report for European Patent Application No. 19215831.9, dated Jul. 3, 2020, 11 pages.
Extended European Search Report for European Patent Application No. 19216159.4, dated May 28, 2020. 9 pages.
Extended European Search Report for European Patent Application No. 19216276.6, dated Jul. 6, 2020, 10 pages.
Magnetics Division of Sprang & Company, Technical Bulletin "Magnetic Cores for Hall Effect Devices", 1997, 6 pages.
Taheri S. et al.: "Equivalent Surface conductivity of ice accumulated on insulators during development of AC and DO flashovers arcs", IEEE Transactions on Dielectrics, IEEE Service Center, Piscataway S, vol. 20, No. 5 Oct. 1, 2013, pp. 1789-1798.
Extended European Search Report for European Patent Application No. 21169946.7, dated Sep. 1, 2021, 7 pages.

* cited by examiner

PROGNOSTIC HEALTH MONITORING FOR HEATER

CROSS-REFERENCE TO RELATED APPLICATION(S)

This application is related to U.S. patent application Ser. No. 16/425,695, entitled "DIFFERENTIAL LEAKAGE CURRENT MEASUREMENT FOR HEATER HEALTH MONITORING", filed May 29, 2019 (Attorney docket number 108385US01-U200-012124).

BACKGROUND

The present disclosure relates generally to probes, and in particular, to a prognostic system for air data probe heaters. Probes are utilized to determine characteristics of an environment. In aircraft systems, for example, air data probes may be implemented on the external portions of the aircraft to aid in determination of conditions such as airspeed, altitude, and angle of attack, among others. Air data probes are prone to ice accretion during flight, which can affect their performance. Accordingly, electrical heaters are integrated into modern air data probes for helping control ice build-up.

Being exposed to harsh environmental conditions and temperature extremes, the electric heaters in air data probes are prone to degradation over time, possibly leading to their ultimate failure. When an air data probe heater fails, the performance of the air data probe can be affected. Moreover, a failed air data probe can ground a flight, thereby impacting flight scheduling. It is desirable to be able to predict when an air data probe heater will require replacement, thereby mitigating the aforementioned impact on an aircraft's operation.

SUMMARY

A system for monitoring the health of a heater connected to a power supply by a first power lead conducting an inlet current and a second power lead conducting an outlet current includes an injection transformer having a number of primary turns that are inductively coupled to the first power lead, a signal generator that is configured to generate and supply a time-varying injection signal to the primary turns thereby impressing the time-varying injection signal on the inlet current, and a signal reader configured to receive a diagnostic signal from the heater, filter the diagnostic signal to pass a frequency associated with the time-varying injection signal, and produce a heater capacitance signal that is indicative of a capacitance value of the heater. The heater capacitance signal is indicative of the health of the heater.

A method of monitoring a health of a heater connected to a power supply by a first power lead conducting an inlet current and a second power lead conducting an outlet current includes generating a time-varying injection signal with a signal generator, supplying the time-varying injection signal to an injection transformer that includes a number of primary turns that are inductively coupled to the first power lead, receiving a diagnostic signal from the heater by a signal reader and passing a frequency associated with the time-varying injection signal, and producing a heater capacitance signal that is indicative of a capacitance value of the heater. The heater capacitance signal is indicative of the health of the heater.

DETAILED DESCRIPTION

Figure 1:
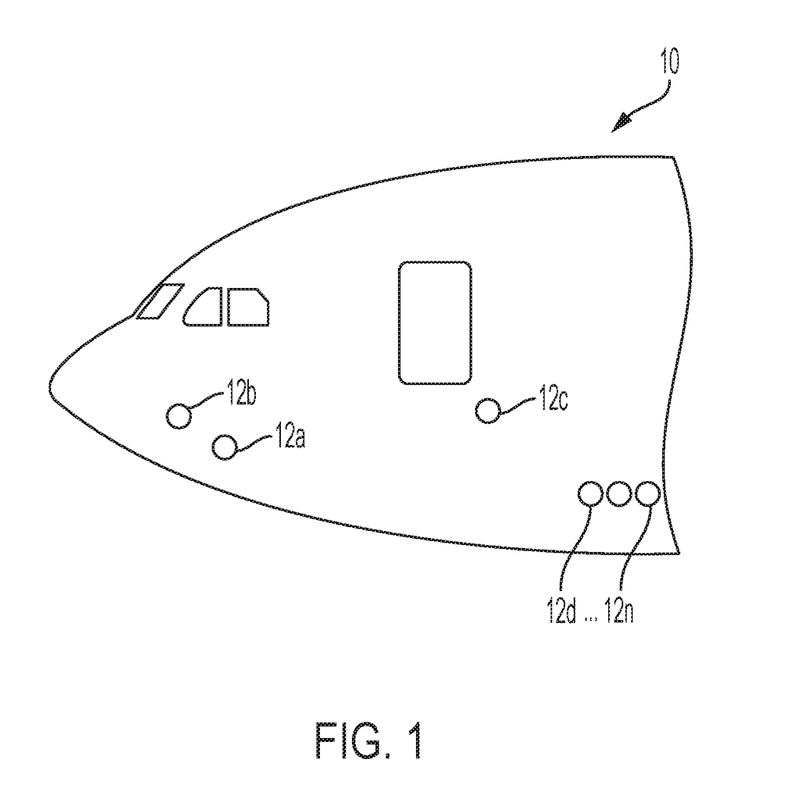
FIG. 1 is a schematic diagram illustrating an aircraft that includes a plurality of air data probes.

FIG. 1 is a schematic diagram illustrating aircraft 10 that includes a plurality of air data probes 12a . . . 12n. Air data probes 12a . . . 12n can be any type of probe with non-limiting examples including pitot probes, pitot-static probes, total air temperature (TAT) probes, or angle-of-attack (AOA) sensors. Any number n of air data probes can be included on a particular aircraft, with each air data probe 12a-12n typically including an integrated heater to control icing. As used in the present disclosure, one of any air data probes 12a-12n can be referred to as air data probe 12. The exemplary embodiment shown in FIG. 1 is a commercial fixed-wing aircraft. Air data probe 12 can be used on other vehicles, with non-limiting examples including military aircraft, rotary wing aircraft, unmanned aerial vehicles, spacecraft, and ground vehicles.

Figure 2A:
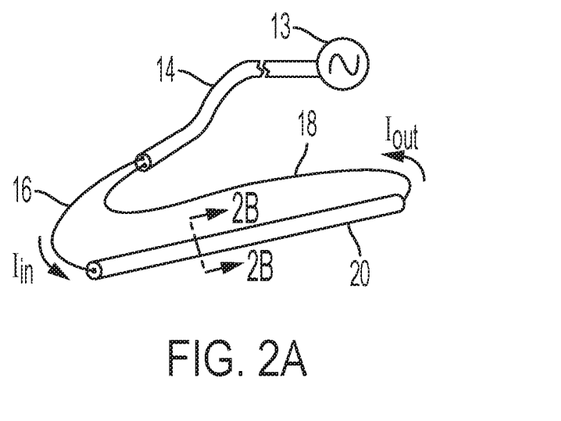
FIG. 2A is a schematic diagram of an air data probe heater circuit.

FIG. 2A is a schematic diagram of an air data probe heater circuit. Shown in FIG. 2A are heater power supply 13, power cable 14, first power lead 16, second power lead 18, and heater 20. Also labeled in FIG. 2A are inlet current $I_{in}$ and outlet current $I_{out}$. Heater power supply 13 provides electrical power via power cable 14. In the illustrated embodiment, heater power supply 13 provides 115 volts alternating current (VAC) at 400 Hz. Heater power supply 13 can also be referred to as aircraft power supply. First power lead 16 and second power lead 18 together provides an electrical connection to heater 20, thereby allowing electrical current to flow through heater 20. Heater 20 can be referred to as an air data probe heater. In a typical embodiment, heater 20 can consume 200-300 Watts in converting electrical power into thermal power. Heater 20 is typically integrated into air data probe 12, and is energized (i.e., powered) to reduce or prevent ice formation on the respective air data probe by raising the surface temperature of the air data probe to a value that can melt and/or control the formation of ice on air data probe 12. Inlet current $I_{in}$ flows into heater 20 through first power lead 16, and outlet current $I_{out}$ flows from heater 20 through second power lead 18, as shown in FIG. 2A. The directions of current flow $I_{in}$, $I_{out}$ are illustrative, using a convention that is used in the electrical art. Under ideal circumstances, $I_{in}$ and $I_{out}$ are approximately equivalent, meaning that there is no other path for current to flow from heater 20. However, heater 20 is prone to failure, as will be described in detail later in FIG. 4. A failure of heater 20 can typically require a replacement of the associated air data probe. It is to be appreciated that the illustrated embodiment is greatly simplified, and associated control circuitry, circuit breakers, and the like are not shown. Moreover, the values provided for power supply voltage and frequency, and heater power consumption, are exemplary and can be different in various embodiments.

Figure 2B:
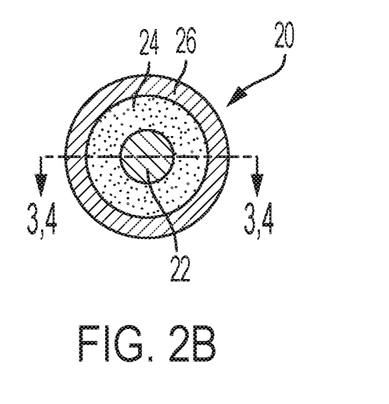
FIG. 2B is a cross-sectional end view of the air data probe heater taken along line 2B-2B of FIG. 2A.

FIG. 2B is a cross-sectional view of an air data probe heater taken along line 2B-2B of FIG. 2A. Shown in FIG. 2B are heater 20, resistive heating element 22, insulation 24, and sheath 26. In the illustrated embodiment, resistive heating element 22 is made of an oxidation-resistant alloy. Insulation 24 surrounds resistive heating element 22. Insulation 24 is an electrically insulating material that provides heat conduction outward from resistive heating element 22. Sheath 26 is an oxidation-resistant metallic material that surrounds insulation 24, thereby containing insulation 24 while providing thermal conductivity from heater 20 to the air data probe in which heater 20 is installed. Insulation 24 can be referred to as electrical insulation. Sheath 26 can be referred to as a metallic sheath. It is to be appreciated that the various materials are selected to provide various desirable properties (e.g., strength, thermal conductivity, oxidation resistance), while also optimizing service life.

Figure 3:
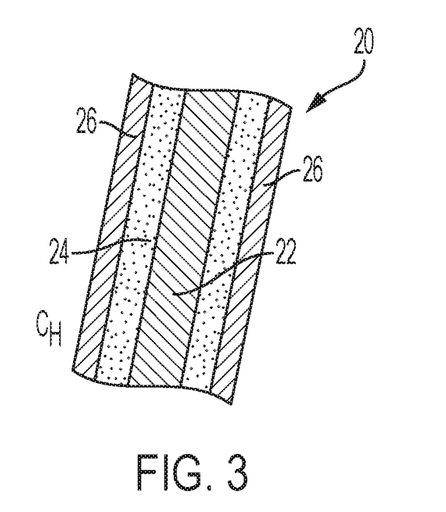
FIG. 3 is a partial cross-sectional side view illustrating the air data probe heater taken along line 3-3 of FIG. 2B

FIG. 3 is a partial cross-sectional side view illustrating heater 20 taken along line 3-3 of FIG. 2B. Shown in FIG. 3 are heater 20, resistive heating element 22, insulation 24, and sheath 26, all having descriptions substantially similar to those provided above in regard to FIGS. 2A-2B. Heater capacitance $C_H$ is also labeled in FIG. 3. Heater 20 can be modeled as an electrical capacitor having heater capacitance $C_H$ (i.e., electrical capacitance) that is determined by the physical dimensions and properties of heater 20. Calculations of electrical capacitance are known to those who are skilled in the electrical art, with heater 20 as shown in FIGS. 2A-2B representing a concentric cylinder capacitor. Accordingly, the value of dielectric constant k for insulation 24 and the separation between resistive heating element 22 and sheath 26 can affect heater capacitance $C_H$ for heater 20 over a service lifetime.

Figure 4:
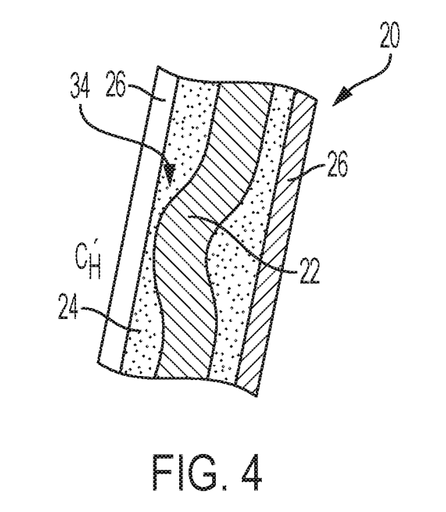
FIG. 4 is a partial cross-sectional side view illustrating the air data probe heater with compromised resistive heating element taken along line 3-3 of FIG. 2B.

FIG. 4 is a partial cross-sectional side view illustrating the heater 20 with compromised resistive heating element 22 taken along line 3-3 of FIG. 2B. FIG. 4 is similar to FIG. 3, while also showing compromised region 34 which reduces the separation between resistive heating element 22 and sheath 26, with resulting compromised heater capacitance $C_H'$. Compromised region 34 can result from a number of causes, with non-limiting examples including mechanical damage, fatigue failure from cyclic operation, thermal expansion, oxidation, and damage to sheath 26. As the extent of compromised region 34 grows over time, a path is created for leakage current ($I_L$) to flow from resistive heating element 22 to sheath 26. Ultimately, an electrical short circuit can develop between resistive heating element 22 and sheath 26. Being able to detect a change in heater capacitance $C_H$ can give an indication of an impending failure of heater 20 before leakage current ($I_L$) begins flowing across insulation 24. In some embodiments, heater capacitance $C_H$ can increase as a result of compromised region 34. In other embodiments, heater capacitance $C_H$ can decrease as a result of compromised region 34.

Other failure modes of heater 20 are also possible. If sheath 26 is compromised, contaminants can leak through sheath 26 to insulation 24, causing the material of insulation 24 to oxidize, change properties, and/or otherwise break down, thereby eventually causing a path for leakage current ($I_L$) to flow from resistive heating element 22 to sheath 26. The introduction of contaminants into insulation 24 can affect the value of dielectric constant k for insulation 24, thereby affecting the value heater capacitance $C_H$. Non-limiting examples of contaminants include oxygen, moisture, dust, carbon, fuel, oil, deicing fluid, and combustion products. Non-limiting examples of events that can compromise sheath 26 include external damage, latent defects, and fatigue failure (e.g., from vibration). The introduction of contaminants into heater 20 (i.e., into insulation 24) can also affect resistive heating element 22, eventually leading to the failure of resistive heating element 22. Accordingly, being able to detect a change in heater capacitance $C_H$ can give an indication of the introduction of contaminants into heater 20 before heater 20 fails and/or before leakage current ($I_L$) flows from resistive heating element 22 to sheath 26. In some embodiments, heater capacitance $C_H$ can increase as a result of contaminants in heater 20. In other embodiments, heater capacitance $C_H$ can decrease as a result of contaminants in heater 20.

Figure 5:
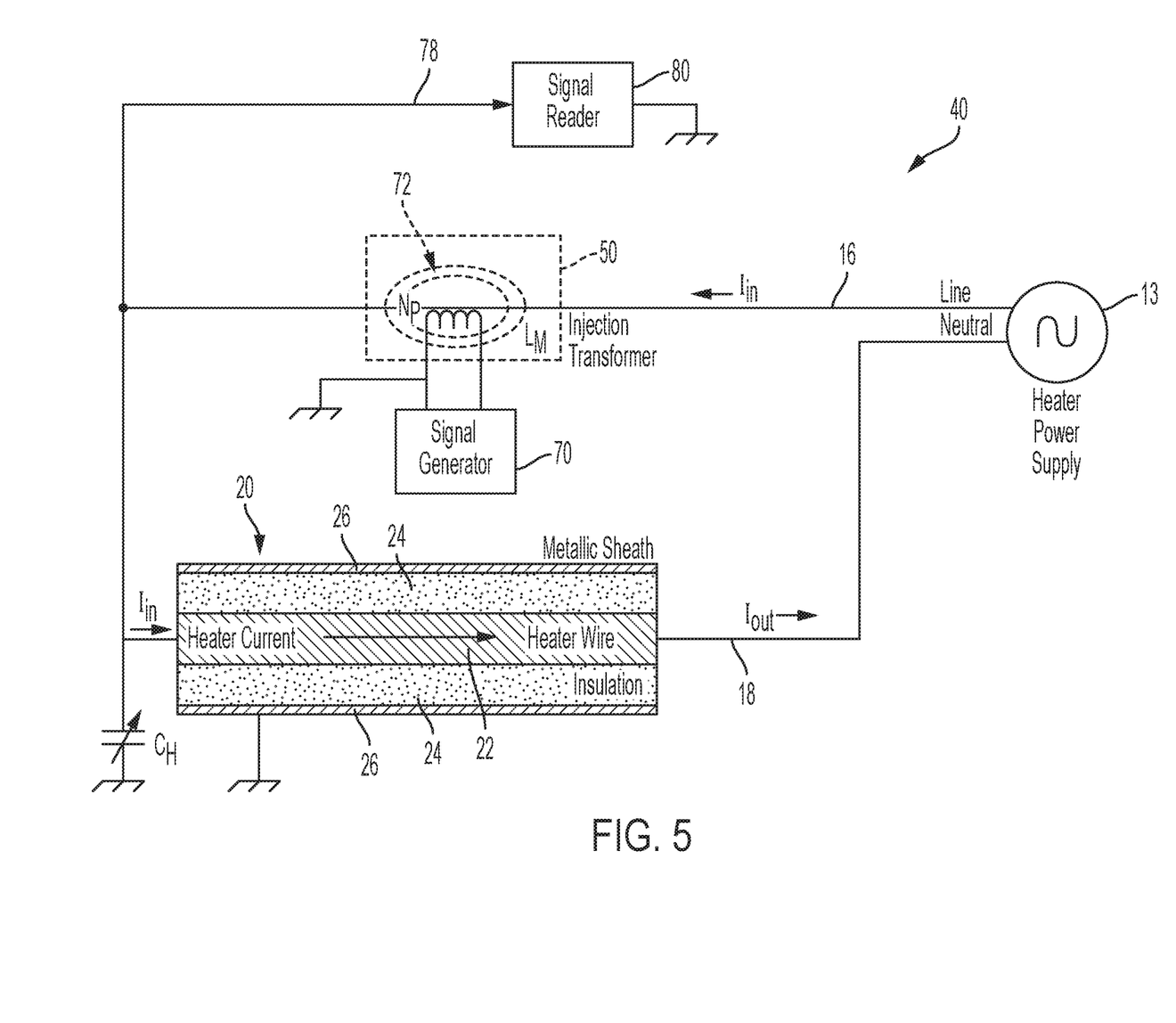
FIG. 5 is a schematic diagram of a capacitance measurement system for the air data probe heater.

FIG. 5 is a schematic diagram of a capacitance measurement system for heater 20. Shown in FIG. 5 are heater power supply 13, power cable 14, first power lead 16, second power lead 18, heater 20, resistive heating element 22, insulation 24, sheath 26, capacitance measurement system 40, injection transformer 50, signal generator 70, injected signal 72, diagnostic signal 78, and signal reader 80. Also labeled in FIG. 5 are inlet current $I_{in}$ and outlet current $I_{out}$ on heater 20, and primary turns $N_P$ and mutual inductance $L_M$ on injection transformer 50. Capacitance measurement system 40 measures heater capacitance $C_H$ over time, thereby providing an indication of a compromised region 34, as described above in regard to FIG. 4. Capacitance measurement system 40 includes injection transformer 50 which introduces injected signal 72 from signal generator 70 onto first power lead 16. In the illustrated embodiment, signal generator 70 produces an AC signal of 10 KHz with a voltage of 20 volts (i.e., 20 VAC, root-mean square (RMS)) that is applied to the primary of injection transformer 50. Mutual inductive coupling by mutual inductance $L_M$ of injection transformer 50 superimposes (i.e., imposes, impresses) injected signal 72 onto first power lead 16. Injected signal 72 can be referred to as a time-varying signal. Accordingly, inlet current $I_{in}$ supplied to heater 20 includes a composite waveform of injected signal 72 (i.e., the time-varying signal) and the voltage supplied by heater power supply 13. Injected signal 72 reactively interacts with heater capacitance $C_H$, thereby producing diagnostic signal 78. Because of the capacitive reactance of heater 20, signal reader 80 can determine heater capacitance $C_H$ from diagnostic signal 78. Accordingly, capacitance measurement system 40 can be used to evaluate heater capacitance $C_H$ over the service life of heater 20. Unless otherwise indicated, all signals are with respect to chassis ground, as depicted in FIG. 5. The direction of current flow (i.e., inlet current $I_{in}$ and outlet current $I_{out}$) shown in FIG. 5 is arbitrary, being labeled by convention. Accordingly, the identification of first power lead 16 and second power lead 18 are arbitrary. In some embodiments, injection transformer 50 can be connected to second power lead 18. Moreover, the location of chassis ground connections shown in FIG. 5 are arbitrary and can be different in different embodiments. In some embodiments, some components of capacitance measurement system 40 can use a floating ground.

In some embodiments, injected signal 72 can have a frequency that ranges from 5-25 KHz. In other embodiments, injected signal 72 can have a frequency that is less than 5 KHz or greater than 25 KHz. In various embodiments, injected signal 72 can have a frequency that is selected to be different from frequencies that are used in other systems, including one or more other capacitance measurement systems 40 for one or more other heaters 20. In these or other embodiments, injected signal 72 can have a frequency that is different from harmonics of the frequency supplied by heater power supply 13. Injection transformer 50 and signal reader 80 will each be described in greater detail, as follows.

Figure 6:
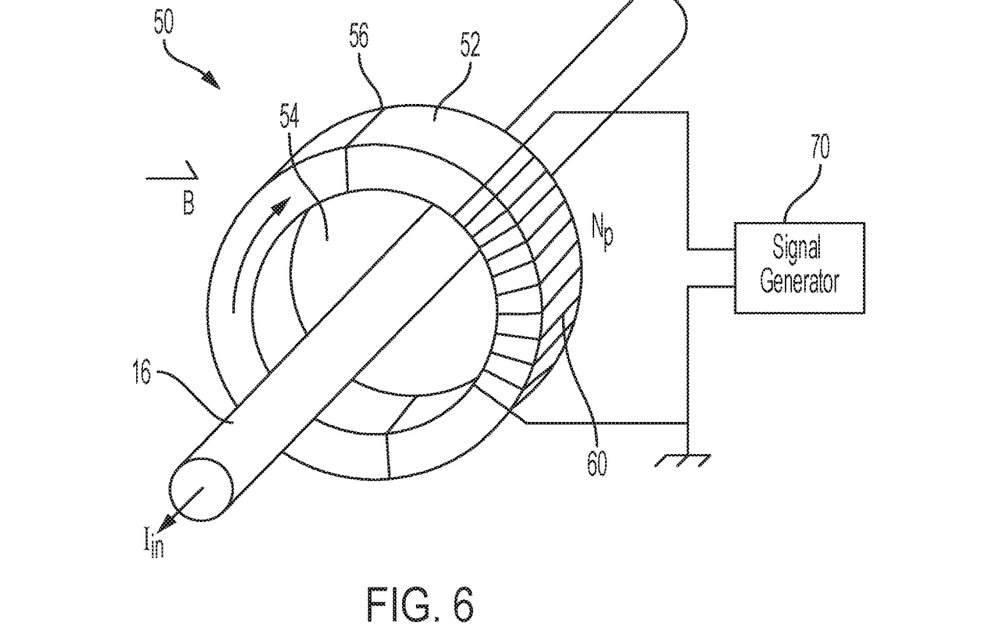
FIG. 6 is a schematic diagram of the injection transformer shown in FIG. 5.

FIG. 6 is a schematic diagram of injection transformer 50 shown in FIG. 5. Shown in FIG. 6 are first power lead 16, injection transformer 50, toroid core 52, toroid center region 54, toroid split 56, primary windings 60 having a number $N_P$ of primary turns, and signal generator 70. Toroid core 52 defines toroid center region 54, thereby providing for the passage of first power lead 16. In the illustrated embodiment, toroid core 52 has toroid split 56, thereby allowing toroid core 52 to be opened and/or separated into two halves, which can be beneficial in fabricating injection transformer 50 on first power lead 16 of an existing installation of heater 20. In some embodiments, toroid split 56 can be omitted from toroid core 52. First power lead 16 can be described as passing through toroid center region 54, as shown in FIG. 6, thereby providing the secondary winding of injection transformer 50 (i.e., having a single secondary turn $N_S$). First power lead 16 can also be described as traversing toroid center region 54. In the illustrated embodiment, toroid core 52 is an iron core transformer. In an exemplary embodiment, toroid core 52 is a ferrite core, made from a material that has a relatively high value of magnetic permeability, as may be commonly used in the electrical art as a transformer core. Toroid core 52 can be referred to as a circular transformer core. In some embodiments, toroid core can be made from other materials that are capable of providing mutual inductive coupling, as will be described. The number of turns of the primary ($N_P$) and secondary ($N_S$) winding on toroid core 52, and the electrical wire thickness and insulation, are designed according to the current transformer known design principles. In the illustrated embodiment, number of primary turns $N_P$ illustrated is reduced for simplicity. In an exemplary embodiment, the number of primary turns $N_P$ can range from about 2,000-3,000. In some embodiments, the number of primary turns $N_p$ can range from about 500-6,000. In other embodiments, the number of primary turns $N_P$ can be fewer than 500 or greater than 6,000. It is known in the electrical art that an alternating current flowing in a conductor passing through a ferrite core induces an alternating magnetic flux $\Phi$(not labeled), thereby creating an alternating magnetic field B, which induces an alternating current in first power lead 16. The alternating magnetic field B can be annotated with a vector symbol, as shown in FIG. 6. As electrical power is delivered to heater 20 by first power lead 16, injected signal 72 is superimposed on the voltage waveform being supplied to heater 20. In various embodiments, a fixture assembly (not shown) can be used to support injection transformer 50 and the various components thereof. A fixture assembly can also be referred to as a clamp assembly, and can provide a housing and hinge assembly (not shown) that can be used to open and close toroid core 52 relative to toroid split 54, thereby facilitating the installation and/or removal of injection transformer on first power lead 16. Other embodiments of injection transformer 50 will be shown and described later, in FIGS. 8-9.

Figure 7:
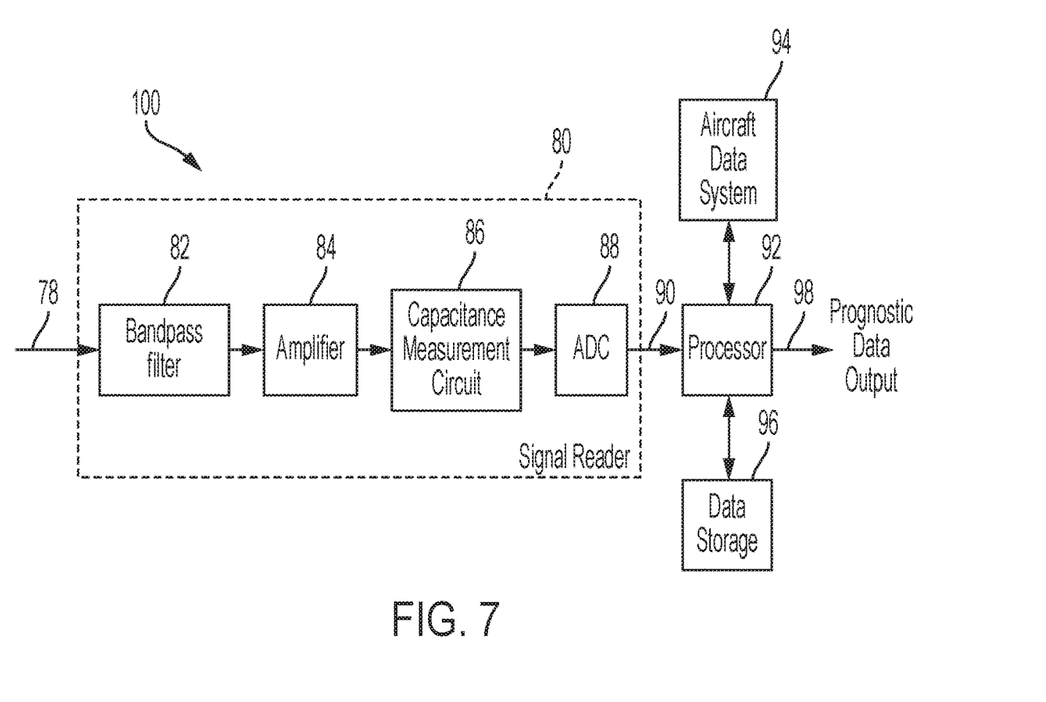
FIG. 7 is a schematic diagram of a capacitive heater health monitoring system.

FIG. 7 is a schematic diagram of a capacitive heater health monitoring system. Shown in FIG. 7 are diagnostic signal 78, signal reader 80, bandpass filter 82, amplifier 84, capacitance measurement circuit 86, analog-to-digital converter (ADC) 88, heater capacitance signal 90, processor 92, aircraft data system 94, data storage 96, prognostic data output 98, and heater health monitoring system 100. Diagnostic signal 78 is received from first power lead 16, as shown in FIG. 5. In the illustrated embodiment, signal reader 80 includes bandpass filter 82, amplifier 84, capacitance measurement circuit 86, ADC 88. Bandpass filter 82 is configured to pass a center frequency $f_c$ that corresponds to the frequency of injected frequency 72 from signal generator 70, thereby removing undesired signal components from diagnostic signal 78. Non-limiting examples of undesired signal components include the fundamental frequency of heater power supply 13 and the harmonics thereof, electromagnetic interference (EMI), switching transients, DC voltage levels, and harmonics of injected frequency 72. In the illustrated embodiment, center frequency $f_c$ and injected frequency 72 are both 10 KHz. In an exemplary embodiment, bandpass filter 82 has a bandwidth of $\pm 10\%$ of $f_c$ (i.e., $\pm 1$ KHz at the $-3$ dB roll-off points). The bandwidth of bandpass filter 82 can be different in other embodiments. Amplifier 84 amplifies the signal level of diagnostic signal 78 after passing through bandpass filter 82, which is then provided to capacitance measurement circuit 86 which measures the capacitive reactance of heater 20, thereby producing a signal that is representative of heater capacitance $C_H$ as determined from the interaction of injected frequency 72 on heater 20, thereby producing diagnostic signal 78. The measurement of in-circuit electrical capacitance based on capacitive reactance is known to those who are skilled in the electrical art. In the illustrated embodiment, bandpass filter 82, amplifier 84, and capacitance measurement circuit 86 are all analog circuits. Next, ADC 88 produces heater capacitance signal 90 as being a digital representation of heater capacitance $C_H$. In some embodiments, bandpass filter 82, amplifier 84, and/or capacitance measurement circuit 86 can be a digital circuit. In these or other embodiments, bandpass filter 82 and/or amplifier 84 can be omitted from signal reader 80.

Referring again to FIG. 7, heater capacitance signal 90 is provided to processor 92. In the illustrated embodiment, processor 92 is a digital processor that receives, stores, scales, and processes heater capacitance signal 90. Processor 92 can also be referred to as a prognostic processor. Processor 92 can receive and process heater capacitance signal 90 continuously or periodically. In various embodiments, processor 92 can include one or more processors (not shown in FIG. 7) that are configured to implement functionality and/or process instructions for execution within processor 92. The one or more processor(s) can be capable of processing instructions stored in one or more storage device(s), which can include data storage 96. Examples of processor(s) can include any one or more of a microprocessor, a controller, a digital signal processor (DSP), an application specific integrated circuit (ASIC), a field-programmable gate array (FPGA), or other equivalent discrete or integrated logic circuitry. Processor 92 produces prognostic data output 98, which can include the measured value of heater capacitance $C_H$. In some embodiments, processor 92 can receive multiple inputs corresponding to digitized heater capacitance signals 90 from multiple associated heaters 20. In other embodiments, processor 92 can receive other inputs associated with heater 20 and/or with aircraft 10. In the illustrated embodiment, processor 92 can exchange data with aircraft data system 94. In yet other embodiments, processor 92 can also receive and process data from sources other than heater capacitance signal 90. In an exemplary embodiment, processor 92 can receive data associated with a measured value of heater capacitance $C_H$ in heater 20. Moreover, in some embodiments, processor 92 can receive data from other aircraft data sources. In some embodiments, processor 92 can utilize data and signal analysis processing techniques on digitized heater capacitance signal(s) 90. In these or other embodiments, processor 92 can be a neural network. In some embodiments, processor 92 can provide information regarding one or more heaters 20 including the present value of heater capacitance $C_H$, the history of heater capacitance $C_H$ over time (e.g., operating time or calendar time), the service life of heater 20 (i.e., operating time), the expected end-of-life (EOL), and the calculated remaining useful life (RUL). The aforementioned data can be included in prognostic data output 98, and/or be provided to other systems (e.g., aircraft data system 94) for use by crew members. In these or other embodiments, processor 92 can provide prognostic data output 98 data that can be transmitted and/or downloaded to engineering teams at an airline's operator, maintenance facility, and/or the various component suppliers whereby the data can be reviewed, analyzed, and/or archived.

In various embodiments, heater 20 is subject to different failure mechanisms, as described above in regard to FIG. 3. Changes in heater capacitance $C_H$ can be used to predict feature failure before it occurs. In some embodiments, changes in heater capacitance $C_H$ can be detected before changes in heater leakage current ($I_L$) can be detected. Accordingly, heater health monitoring system 100 can be beneficial in predicting a failure of heater 20 before another indication of heater failure occurs. An example of another indication of heater failure can be an increase in heater leakage current ($I_L$), which can be detected by a heater leakage current measurement system (not shown). Because the failure mechanism of heater 20 can be different in various embodiments and/or under various operating conditions, a change in heater capacitance $C_H$ in either direction (i.e., an increasing or decreasing value over time) can provide an indication of heater degradation. In some embodiments, processor 92 (i.e., prognostic processor) can be configured to identify the nature of the degradation based on the change and/or the rate of change of heater capacitance $C_H$. In these or other embodiments, processor 92 can correlate changes in heater capacitance $C_H$ with other operating parameters as may be provided by aircraft data system 94 to identify the nature of the degradation in heater 20.

Referring again to FIG. 7, when installed on aircraft 10 that includes one or more heaters 20, heater health monitoring system 100 can track the health of each heater 20 in the system, allowing maintenance personnel to predict when failure is likely to occur so that maintenance can be scheduled prior to the point of expected failure for any particular heater 20. This can avoid flight delays that could ground an aircraft for emergent maintenance requirements, and it can also help prevent the in-flight failure of a particular heater 20 that could be disruptive to the performance of an associated air data probe 12. The exemplary embodiment of capacitance measurement system 40 and associated heater health monitoring system 100 is on heater 20 as used on an air data probe 12 (e.g., as on aircraft 10 shown in FIG. 1). The scope of the present disclosure includes the usage of health monitoring system 40 on any electrical heater, without regard to voltage, frequency, and/or power, regardless of location. Non-limiting examples of electrical power that can be supplied from heater power supply 13 include AC frequencies of 50 Hz and 60 Hz, and also direct current (DC) voltage. Non-limiting examples of voltages that can be supplied from heater power supply 13 include 28 VDC, 115 VAC, 120 VAC, 200 VAC, 220 VAC, and 240 VAC. All voltages and frequencies (i.e., DC, or AC of any frequency) are within the scope of the present disclosure. Accordingly, heater health monitoring system 100 can be used on one or more heaters 20 that are located or installed in any vehicle, building, or other location, regardless of the electrical power characteristics of heater power supply 13. Non-limiting examples of other types of heaters include wing ice protection heaters, water heaters, and floor heaters. The scope of the present disclosure also includes insulation health monitoring on other electrical systems including, for example, cables, motors, and transformers.

Figure 8:
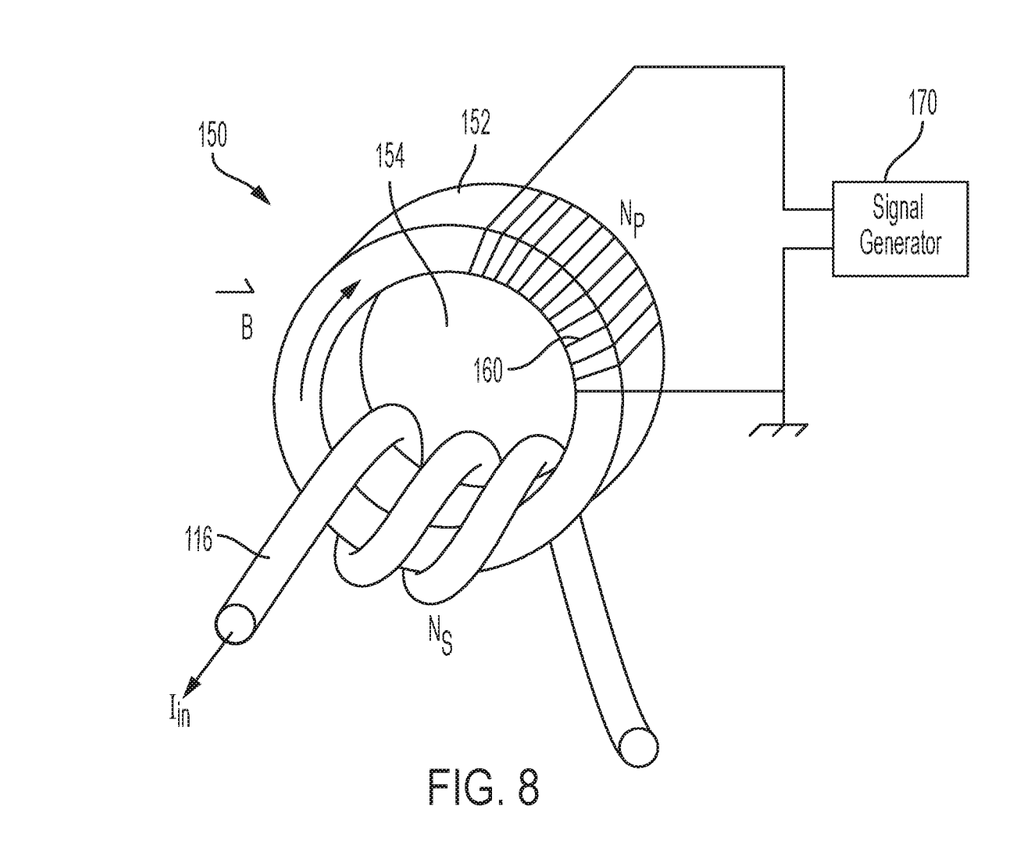
FIG. 8 is a schematic diagram of a second embodiment of the injection transformer shown in FIG. 5.

FIG. 8 is a schematic diagram of a second embodiment of the injection transformer shown in FIG. 5. Shown in FIG. 8 are first power lead 116, injection transformer 150, toroid core 152, toroid center region 154, primary windings 160 having $N_P$ primary turns, and signal generator 170, all having descriptions substantially similar to those provided above in regard to FIG. 6. In the illustrated embodiment, first power lead 116 passes through (i.e., traverses) toroid center region 154 three times. Accordingly, the number of secondary turns $N_S$ can be said to be three, and the amplitude of the injected signal (not labeled in FIG. 8) is about three times as great as that provided in injection transformer 50 shown and described above in regard to FIG. 6 (i.e., having a single secondary turn $N_S$) for the same number of primary turns $N_P$. As noted above in regard to FIG. 6, the number of primary turns $N_P$ can be different in various embodiments. In the illustrated embodiment, a toroid split is not shown on toroid core 152 but can be provided if desired in any particular embodiment. In the embodiments shown in FIGS. 6 and 8, toroid core 52, 152 was used as a magnetic core, but non-toroid shapes are within the scope of the present disclosure. Non-limiting exemplary non-toroid shapes include oval, elliptical, hexagonal, pentagonal, square, and rectangular. Moreover, magnetic cores having geometric shapes that involve more than a single opening (i.e., single magnetic flux circuit) can also be used, with non-limiting examples including E-cores and EI-cores.

Figure 9:
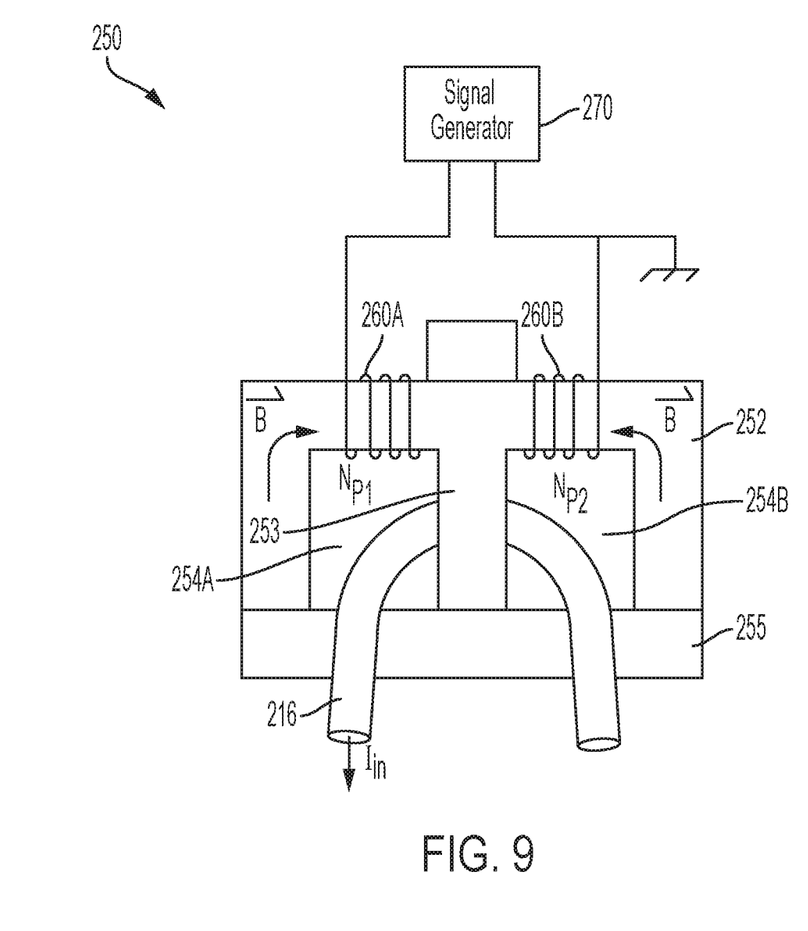
FIG. 9 is a schematic diagram of a third embodiment of the injection transformer shown in FIG. 5.

FIG. 9 is a schematic diagram of a third embodiment of the injection transformer shown in FIG. 5. Shown in FIG. 9 are first power lead 216, injection transformer 250, E-core 252, center regions 254A, 254B, I-core 255, primary windings 260A, 260B having $N_{P1}$, $N_{P2}$ primary turns respectively, and signal generator 270. E-core 252 and I-core 255, when joined together as shown in FIG. 9 form an EI-core transformer that defines center regions 254A, 254B through which first power lead 216 passes one or more times. In some embodiments, an advantage of using an EI-core for differential current detector 450 is the relative ease of separating and/or joining E-core 452 and I-core 455, which can be beneficial in installing injection transformer 250 on an existing first power lead 216. The EI-core injection transformer 250 shown in FIG. 9 can be used in some embodiments to provide a compact design instead of using a toroid core as shown in FIGS. 6 and 8.

The various embodiments of injection transformer 50, 150, 250 shown and described above are exemplary, and can vary in different embodiments. In the illustrated embodiments, a ferromagnetic material was shown for the magnetic core. An advantage of using a ferromagnetic core is that a relatively large mutual inductive coupling can be provided between the primary windings and the one or more secondary windings in a relatively small volume. However, a ferromagnetic core adds mass to a system, and can also be subject to magnetic saturation. In an alternative embodiment, injection transformer 50 can use a non-ferromagnetic core, with an air core transformer being an exemplary embodiment. An exemplary air core transformer is a Rogowski coil.

Discussion of Possible Embodiments

A system for monitoring a health of a heater connected to a power supply by a first power lead conducting an inlet current and a second power lead conducting an outlet current, the system comprising: an injection transformer, comprising a plurality of primary turns that are inductively coupled to the first power lead; a signal generator, configured to: generate a time-varying injection signal; and supply the time-varying injection signal to the plurality of primary turns, thereby impressing the time-varying injection signal on the inlet current; and a signal reader, configured to: receive a diagnostic signal from the heater; filter the diagnostic signal to pass a frequency associated with the time-varying injection signal; and produce a heater capacitance signal that is indicative of a capacitance value of the heater; wherein: the heater capacitance signal is indicative of the health of the heater.

The system of the preceding paragraph can optionally include, additionally and/or alternatively, any one or more of the following features, configurations and/or additional components:

A further embodiment of the foregoing system, wherein the injection transformer comprises a ferromagnetic core configured to produce a mutual inductive coupling between the plurality of primary turns and the first power lead.

A further embodiment of the foregoing system, wherein: the injection transformer comprises a toroid core defining a center region; the plurality of primary windings are wound around the toroid core; and the first power lead is configured to pass through the center region one or more times.

A further embodiment of the foregoing system, wherein the signal reader comprises: a band pass filter, configured to pass the frequency associated with the time-varying injection signal while attenuating frequencies less than and greater than the frequency associated with the time-varying injection signal; and a capacitance measurement circuit configured to produce the heater capacitance signal in response to a capacitive reactance of the heater; and wherein: the heater comprises: a resistive heating element; electrical insulation surrounding the resistive heating element; and a metallic sheath surrounding the electrical insulation; and the capacitive reactance depends at least in part on a condition of the electrical insulation.

A further embodiment of the foregoing system, wherein the signal reader further comprises an amplifier, configured to: amplify the frequency associated with the time-varying injection signal; and provide the amplified frequency associated with the time-varying injection signal to the capacitance measurement circuit.

A further embodiment of the foregoing system, wherein the signal reader further comprises an analog-to-digital converter (ADC), configured to convert the heater capacitance signal to a digitized heater capacitance signal.

A further embodiment of the foregoing system, further comprising a processor, configured to: receive the digitized heater capacitance signal; and produce a prognostic data output representative of the heater health.

A further embodiment of the foregoing system, wherein the primary winding comprises a number of primary turns that range from 500-6,000.

A further embodiment of the foregoing system, wherein the primary winding comprises a number of primary turns that range from 2,000-3,000.

A further embodiment of the foregoing system, wherein the time-varying injection signal comprises a frequency that ranges from 5-25 KHz.

A further embodiment of the foregoing system, wherein the injection transformer comprises a square core or an EI-core.

A further embodiment of the foregoing system, wherein the injection transformer comprises an air core.

A method of monitoring a health of a heater connected to a power supply by a first power lead conducting an inlet current and a second power lead conducting an outlet current, the method comprising: generating, with a signal generator, a time-varying injection signal; supplying, to an injection transformer comprising a plurality of primary turns that are inductively coupled to the first power lead, the time-varying injection signal; receiving, by a signal reader, a diagnostic signal from the heater; passing, by the signal reader, a frequency associated with the time-varying injection signal; and producing, by the signal reader, a heater capacitance signal that is indicative of a capacitance value of the heater; wherein: the heater capacitance signal is indicative of the health of the heater.

The method of the preceding paragraph can optionally include, additionally and/or alternatively, any one or more of the following features, configurations and/or additional components:

A further embodiment of the foregoing method, wherein the injection transformer comprises a ferromagnetic core configured to produce a mutual inductive coupling between the plurality of primary turns and the first power lead.

A further embodiment of the foregoing method, wherein: the injection transformer comprises a toroid core defining a center region; the plurality of primary windings are wound around the toroid core; and the first power lead is configured to pass through the center region one or more times.

A further embodiment of the foregoing method, wherein the heater comprises a resistive heating element, electrical insulation surrounding the resistive heating element, and a metallic sheath surrounding the electrical insulation, and the method further comprises: passing, by a band pass filter, the frequency associated with the time-varying injection signal while attenuating frequencies less than and greater than the frequency associated with the time-varying injection signal; and producing, by a capacitance measurement circuit, the heater capacitance signal in response to a capacitive reactance of the heater that depends at least in part on a condition for the electrical insulation.

A further embodiment of the foregoing method, further comprising converting, by an analog-to-digital converter (ADC), the heater capacitance signal into a digitized heater capacitance signal.

A further embodiment of the foregoing method, wherein the primary winding comprises a number of primary turns that range from 500-6,000.

A further embodiment of the foregoing method, wherein the time-varying injection signal comprises a frequency that ranges from 5-25 KHz.

A further embodiment of the foregoing method, further comprising: receiving, by a processor, the digitized heater capacitance signal; and producing, by the processor, a prognostic data output representative of the heater health.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodi-

The invention claimed is:

1. A system for monitoring a health of a heater having a resistive heating element, electrical insulation surrounding the resistive heating element, and a metallic sheath surrounding the electrical insulation, the heater connected to a power supply by a first power lead conducting an inlet current and a second power lead conducting an outlet current, the system comprising:
   an injection transformer, comprising a plurality of primary turns that are inductively coupled to the first power lead;
   a signal generator, configured to:
      generate a time-varying injection signal; and
      supply the time-varying injection signal to the plurality of primary turns, thereby impressing the time-varying injection signal on the inlet current; and
   a signal reader configured to receive a diagnostic signal from the heater, the signal reader comprising:
      a band pass filter, configured to filter the diagnostic signal to pass a frequency associated with the time-varying injection signal while attenuating frequencies less than and greater than the frequency associated with the time-varying injection signal; and
      a capacitance measurement circuit configured to produce a heater capacitance signal in response to a capacitive reactance of the heater, the capacitance signal that is indicative of a capacitance value of the heater;
   wherein:
      the capacitive reactance depends at least in part on a condition of the electrical insulation, and
      the heater capacitance signal is indicative of the health of the heater.

2. The system of claim 1, wherein the injection transformer comprises a ferromagnetic core configured to produce a mutual inductive coupling between the plurality of primary turns and the first power lead.

3. The system of claim 1, wherein:
   the injection transformer comprises a toroid core defining a center region;
   the plurality of primary windings are wound around the toroid core; and
   the first power lead is configured to pass through the center region one or more times.

4. The system of claim 1, wherein the signal reader further comprises an amplifier, configured to:
   amplify the frequency associated with the time-varying injection signal; and
   provide the amplified frequency associated with the time-varying injection signal to the capacitance measurement circuit.

5. The system of claim 4, wherein the signal reader further comprises an analog-to-digital converter (ADC), configured to convert the heater capacitance signal to a digitized heater capacitance signal.

6. The system of claim 5, further comprising a processor, configured to:
   receive the digitized heater capacitance signal; and
   produce a prognostic data output representative of the heater health.

7. The system of claim 1, wherein the primary winding comprises a number of primary turns that range from 500-6,000.

8. The system of claim 7, wherein the primary winding comprises a number of primary turns that range from 2,000-3,000.

9. The system of claim 1, wherein the time-varying injection signal comprises a frequency that ranges from 5-25 KHz.

10. The system of claim 1, wherein the injection transformer comprises a square core or an EI-core.

11. The system of claim 1, wherein the injection transformer comprises an air core.

12. The method of claim 1, wherein:
   the injection transformer comprises a toroid core defining a center region;
   the plurality of primary windings are wound around the toroid core; and
   the first power lead is configured to pass through the center region one or more times.

13. A method of monitoring a health of a heater having a resistive heating element, electrical insulation surrounding the resistive heating element, and a metallic sheath surrounding the electrical insulation, the heater connected to a power supply by a first power lead conducting an inlet current and a second power lead conducting an outlet current, the method comprising:
   generating, with a signal generator, a time-varying injection signal;
   supplying, to an injection transformer comprising a plurality of primary turns that are inductively coupled to the first power lead, the time-varying injection signal;
   receiving, by a signal reader, a diagnostic signal from the heater;
   passing, by the signal reader, a frequency associated with the time-varying injection signal;
   passing, by a band pass filter, the frequency associated with the time-varying injection signal while attenuating frequencies less than and greater than the frequency associated with the time-varying injection signal; and
   producing, by a capacitance measurement circuit, the heater capacitance signal in response to a capacitive reactance of the heater that depends at least in part on a condition for the electrical insulation; and
   producing, by a capacitance measurement circuit of the signal reader, a heater capacitance signal in response to a capacitive reactance of the heater, the capacitance signal indicative of a capacitance value of the heater;
   wherein:
      the capacitive reactance depends at least in part on a condition of the electrical insulation, and
      the heater capacitance signal is indicative of the health of the heater.

14. The method of claim 13, wherein the injection transformer comprises a ferromagnetic core configured to produce a mutual inductive coupling between the plurality of primary turns and the first power lead.

15. The method of claim 13, further comprising converting, by an analog-to-digital converter (ADC), the heater capacitance signal into a digitized heater capacitance signal.

16. The method of claim 15, further comprising:
   receiving, by a processor, the digitized heater capacitance signal; and
   producing, by the processor, a prognostic data output representative of the heater health.

17. The method of claim 13, wherein the primary winding comprises a number of primary turns that range from 500-6,000.

18. The method of claim 13, wherein the time-varying injection signal comprises a frequency that ranges from 5-25 KHz.

* * * * *